(12) United States Patent
Hajdarbasic et al.

(10) Patent No.: US 11,733,299 B2
(45) Date of Patent: Aug. 22, 2023

(54) TEST APPARATUS AND METHOD FOR SYNTHETICALLY TESTING AT LEAST ONE SWITCH DEVICE FOR A HIGH-VOLTAGE BATTERY OF A VEHICLE

(71) Applicant: Bayerische Motoren Werke Aktiengesellschaft, Munich (DE)

(72) Inventors: Suljo Hajdarbasic, Munich (DE); Florian Pritscher, Munich (DE); Andre Ribeiro, Munich (DE); Wladislaw Waag, Munich (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 359 days.

(21) Appl. No.: 16/963,534

(22) PCT Filed: Mar. 27, 2019

(86) PCT No.: PCT/EP2019/057756
§ 371 (c)(1),
(2) Date: Jul. 21, 2020

(87) PCT Pub. No.: WO2019/206552
PCT Pub. Date: Oct. 31, 2019

(65) Prior Publication Data
US 2021/0048477 A1 Feb. 18, 2021

(30) Foreign Application Priority Data
Apr. 25, 2018 (DE) ...................... 10 2018 206 337.0

(51) Int. Cl.
*G01R 31/327* (2006.01)
*G01R 31/333* (2006.01)

(52) U.S. Cl.
CPC ..... *G01R 31/3272* (2013.01); *G01R 31/3336* (2013.01)

(58) Field of Classification Search
CPC ............ G01R 31/3272; G01R 31/3336; H03K 17/689; H01H 11/0062
See application file for complete search history.

(56) References Cited

U.S. PATENT DOCUMENTS

| 3,942,103 A | 3/1976 | Kind et al. |
| 10,162,008 B2 * | 12/2018 | Kinsella ................. G01R 31/34 |

(Continued)

FOREIGN PATENT DOCUMENTS

| CN | 101718842 A | 6/2010 |
| CN | 102959412 A | 3/2013 |

(Continued)

OTHER PUBLICATIONS

Chinese-language Office Action issued in Chinese Application No. 201980007016.6 dated Feb. 14, 2022 with English translation (18 pages).

(Continued)

*Primary Examiner* — Jeff W Natalini
(74) *Attorney, Agent, or Firm* — Crowell & Moring LLP

(57) ABSTRACT

A test apparatus for testing at least one switch device for a high-voltage battery of a vehicle, includes a voltage source for generating an electrical test voltage between a positive high-voltage path and a negative high-voltage path of the at least one switch device. The test apparatus has a first connecting device and a first current source for feeding a first electrical test current into the positive high-voltage path, wherein the first connecting device, the first current source and the positive high-voltage path together form a first circuit when testing the at least one switch device. The test apparatus has a second connecting device and a second current source for feeding a second electrical test current into the negative high-voltage path, wherein the second connecting device, the second current source and the nega- (Continued)

tive high-voltage path together form a second circuit when testing the at least one switch device.

11 Claims, 4 Drawing Sheets

(56) References Cited

U.S. PATENT DOCUMENTS

| | | | |
|---|---|---|---|
| 11,169,210 B2 * | 11/2021 | Song | G01R 31/3277 |
| 11,346,881 B1 * | 5/2022 | Bilstein | G01R 31/2834 |
| 2010/0134115 A1 * | 6/2010 | Ohnuki | B60L 58/21 |
| | | | 324/429 |
| 2011/0187376 A1 | 8/2011 | Barrenscheen et al. | |
| 2013/0162261 A1 | 6/2013 | Szoke et al. | |
| 2014/0028322 A1 | 1/2014 | Tzivanopoulous | |
| 2015/0219706 A1 | 8/2015 | Loftus et al. | |
| 2015/0276842 A1 | 10/2015 | Chang et al. | |
| 2016/0178672 A1 * | 6/2016 | Edwards | H01H 9/167 |
| | | | 324/415 |
| 2017/0106754 A1 | 4/2017 | Schmelzer | |
| 2017/0108544 A1 | 4/2017 | Schmelzer | |
| 2017/0297447 A1 | 10/2017 | Tzivanopoulos et al. | |
| 2018/0037134 A1 * | 2/2018 | Weicker | H01M 10/425 |
| 2019/0064280 A1 * | 2/2019 | Sun | G01R 31/14 |

FOREIGN PATENT DOCUMENTS

| | | |
|---|---|---|
| CN | 103576046 A | 2/2014 |
| CN | 106053975 A | 10/2016 |
| CN | 106068458 A | 11/2016 |
| CN | 106104283 A | 11/2016 |
| CN | 107005065 A | 8/2017 |
| DE | 23 36 713 A1 | 2/1975 |
| DE | 10 2006 050 529 A1 | 4/2008 |
| DE | 10 2011 003 279 A1 | 8/2011 |
| DE | 10 2012 213 159 A1 | 1/2014 |
| DE | 10 2015 104 090 A1 | 10/2015 |
| DE | 10 2014 215 260 A1 | 2/2016 |
| EP | 0 342 321 A1 | 11/1989 |
| EP | 1 047 850 A2 | 2/2001 |
| EP | 1 074 850 A2 | 2/2001 |
| GB | 904829 A | 8/1962 |
| JP | 2014-202625 A | 10/2014 |
| WO | WO 2017/199397 A1 | 11/2017 |

OTHER PUBLICATIONS

International Search Report (PCT/ISA/210) issued in PCT Application No. PCT/EP2019/057756 dated Jun. 25, 2019 with English translation (six (6) pages).

German-language Written Opinion (PCT/ISA/237) issued in PCT Application No. PCT/EP2019/057756 dated Jun. 25, 2019 (seven (7) pages).

German-language Office Action issued in German Application No. 10 2018 206 337.0 dated Dec. 14, 2018 (five (5) pages).

Sheng, "A Synthetic Test Circuit for Current Switching Tests of HVDC Circuit Breakers", Transmission and Distribution Conference and Exposition, IEEE, Apr. 21, 2008, pp. 1-4, XP031250195 (four pages).

* cited by examiner

TEST APPARATUS AND METHOD FOR SYNTHETICALLY TESTING AT LEAST ONE SWITCH DEVICE FOR A HIGH-VOLTAGE BATTERY OF A VEHICLE

BACKGROUND AND SUMMARY OF THE INVENTION

The present invention relates to a test apparatus for testing at least one switch device for a high-voltage battery of a vehicle, with a voltage source for generating an electrical test voltage between a positive high-voltage path and a negative high-voltage path of the at least one switch device. In addition, the present invention relates to an arrangement with such a test apparatus and at least one switch device. Finally, the present invention relates to a method for testing at least one switch device for a high-voltage battery of a vehicle.

A high-voltage battery, as is used for example in electrified vehicles, typically comprises electrical and/or electromechanical components carrying high voltage. These components serve for example for measuring current, measuring voltage and/or disconnecting the high-voltage battery. These components are under a high electrical voltage and the components conduct a high electrical current. These components may be arranged in a common housing or be distributed in the high-voltage battery. The components may however also be located outside the high-voltage battery.

Such a component is a so-called switch device. This switch device may also be referred to as a switch box, a junction box, a battery disconnect unit or a battery management unit. The switch device comprises a positive high-voltage path and a negative high-voltage path, over which the operating current of the switch device flows when the switching elements in the switch device that are usually present in it are closed. Typically used switching elements are electromechanical relays, fuses, pyrotechnic circuit breakers or the like. With closed switching elements, the high-voltage paths are each intrinsically formed with low impedance, so that little heat is produced during operation. The high-voltage paths are isolated from one another with high impedance in the switch device by an insulating resistance.

In this respect, DE 10 2014 215 260 A1 describes a method for testing the function of a switch device, in particular of a battery system. This involves the switch device being actuated by applying an electrical voltage or an electrical current. It is provided that the switch device is excited to oscillate by a voltage signal or a current signal, and then a voltage profile or a current profile of the switching device is monitored. However, a response signal generated by the excited switch device can be detected, the functional capability of the switch device being inferred according to the response signal.

If the switch device is tested alone, but under the full test voltage and with the full test current, voltage sources that can simultaneously generate the high test current and the high test voltage are usually used instead of the battery cells of the high-voltage battery. Since the voltage source must deliver the high test voltage and the high test current simultaneously, it is required that it is designed for a high power output. As a result, the voltage source becomes very expensive and large. Moreover, for testing the switch device, an electronic load is typically used as the load, which then can also take up the correspondingly high electrical power output. In a typical setup for testing the switch device, the components must be able to provide or be designed for a high power output. This electrical power output is not however consumed in the test object or the switch device, but is only transferred between the voltage source and the load—in a way similar to what also happens in an actual high-voltage battery.

The object of the present invention is to present a solution for how the testing of a switch device of the type mentioned at the beginning can be carried out more efficiently and at lower cost.

This object is achieved according to the invention by a test apparatus, by an arrangement and also by a method with the features according to the independent patent claims. Advantageous developments of the present invention are specified in the dependent patent claims.

A test apparatus according to the invention serves for testing at least one switch device for a high-voltage battery of a vehicle. The test apparatus comprises a voltage source for generating an electrical test voltage between a positive high-voltage path and a negative high-voltage path of the at least one switch device. In addition, the test apparatus comprises a first connecting device and a first current source for feeding a first electrical test current into the positive high-voltage path, wherein the first connecting device, the first current source and the positive high-voltage path together form a first circuit when testing the at least one switch device. Furthermore, the test apparatus comprises a second connecting device and a second current source for feeding a second electrical test current into the negative high-voltage path, wherein the second connecting device, the second current source and the negative high-voltage path together form a second circuit when testing the at least one switch device.

With the aid of the test apparatus, the switch device can be tested. In particular, the test apparatus serves for carrying out a high-current and high-voltage test of the switch device. The switch device is usually used as a component of the high-voltage battery of a vehicle, in particular an electrically driven vehicle. The switch device has the positive high-voltage path and the negative high-voltage path. The positive high-voltage path and the negative high-voltage path may have in each case an input and an output. If the switch device is used in the high-voltage battery, the inputs can be connected to the electrically switched battery cells and the outputs can be connected to a load or consumers. In the positive high-voltage path and/or the negative high-voltage path, corresponding switching elements for galvanically isolating the respective high-voltage path may be provided. Such switching elements may be switches, contactors, relays, transistors, pyrotechnic isolating devices or the like. Moreover, a fuse may be provided in the positive high-voltage path and/or the negative high-voltage path. An insulating device for electrically insulating the positive high-voltage path from the negative high-voltage path may be provided between the positive high-voltage path and the negative high-voltage path. Furthermore, a measuring resistance, at which the electrical voltage can be measured, may be provided between the positive high-voltage path and the negative high-voltage path. The insulating device and, if provided, the measuring resistance form a high-impedance insulating resistance. Before the switch device is installed in the high-voltage battery, it is required to test it for its functional capability. The test apparatus is used for this.

The test apparatus comprises the voltage source, with which the electrical test voltage can be applied between the positive high-voltage path and the negative high-voltage path or at the insulating device for testing the switch device. The test voltage may be in particular a high voltage, which may be several 100 volts. According to an essential aspect of the present invention, it is provided that the test apparatus also has the first current source. With the aid of the first current source, the first electrical test current can be fed into the positive high-voltage path. Moreover, the test apparatus comprises the first connecting device, which serves for electrically connecting the first current source to the positive high-voltage path. In the simplest case, the first connecting device may be provided by corresponding electrical connecting lines or cables. By means of the first connecting device, for example, a plug-in connection between the first current source and the positive high-voltage path can be provided. It is in this case provided that the first connecting device, the first current source and the positive high-voltage path together form the first circuit when testing the at least one switch device. In particular, it is provided that, when the switch elements in the first high-voltage path are closed, a closed first circuit is provided by the first connecting device, the first current source and the positive high-voltage path. This first current source is provided separately from the voltage source. In addition, the second current source is provided separately from the voltage source and from the first current source. The second current source serves for feeding the second electrical test current into the negative high-voltage path. Furthermore, the test apparatus comprises the second connecting device, wherein the second connecting device together with the second current source and the negative high-voltage path forms the second circuit. The second connecting device may be formed in a way analogous to the first connecting device. The second circuit is also formed in particular as a closed circuit when the switching elements in the negative high-voltage path are closed. With the first current source and the second current source, preferably a so-called high current, in particular an electrical current with a current intensity of several 100 amperes, can in each case be provided.

Consequently, a high-current test and a high-voltage test of the switch device can be made possible by the test apparatus according to the invention, without high power sources and corresponding high power loads. In this case, the first current source, the second current source and the voltage source are isolated from one another, so that only low electrical power outputs have to be implemented in each case. As already explained, the test apparatus may in the simplest case have the voltage source and the first and second current sources. The first and second current sources generate the high test current, but also only provide a low electrical voltage, because they each only have to separately handle the low electrical resistance of the positive high-voltage path or the negative high-voltage path. With the voltage source, the high electrical test voltage can be provided, but only a small electrical current can be generated, only flowing over the high insulating resistance. It is consequently not necessary that the voltage source or the current sources have a high electrical power output, because none of the sources has to generate a high voltage and a high current simultaneously. Consequently, testing of the at least one switch device can be carried out more efficiently and at lower cost.

Preferably, the test apparatus has a third connecting device, wherein the voltage source, the third connecting device and an insulating device of the switch device between the positive high-voltage path and the negative high-voltage path form a third circuit. This third circuit is in particular a closed circuit when the test apparatus for testing the switch device is connected to the switch device. The third circuit may be formed isolated from the first circuit and/or the second circuit. The first, second and third circuits may also be partially connected to one another. The circuits may be connected to one another with high impedance by way of the insulating device. The insulating device, together with the measuring resistance, if provided, has the insulating resistance. The insulating resistance may typically lie in the range between several megaohms and several gigaohms. With the voltage source, the test voltage, which may be several 100 volts, can be provided. Consequently, the high-voltage test of the switch device can be carried out with the aid of the voltage source.

Furthermore, it is advantageous if the test apparatus has at least one isolating device for galvanically isolating the voltage source, the first current source and/or the second current source from an electrical supply network. The voltage source, the first current source and the second current source may be supplied with electrical energy by the electrical supply network. The sources have in this case a galvanic isolation from the supply network. This can be made possible with the aid of the at least one isolating device, which comprises at least one isolating transformer. This isolating device may be installed in the respective source itself. As an alternative or in addition, the voltage source, the first current source and/or the second current source may each be coupled to the electrical supply network by way of an isolating transformer of its own. In this way it can be achieved that the first current source is at the potential of the positive high-voltage path and that the second current source is at the potential of the negative high-voltage path.

In a further embodiment, the test apparatus has a control device for independently activating the voltage source, the first current source and/or the second current source. For the activation, respective control signals can be transmitted by means of the control device to the first current source, the second current source and/or the voltage source. By the activation of the voltage source by means of the control device, the test voltage provided by the voltage source can be set or changed. By the activation of the first current source by means of the control device, the current intensity of the first test current can be determined or adapted. Furthermore, by the activation of the second current source by means of the control device, the current intensity of the second test current can be determined or adapted. Consequently, a time profile of the test voltage, of the first test current and/or of the second test current may for example be prescribed for the testing of the switch device. The test apparatus may also have a corresponding memory, in which the profiles of the test voltage, the first test current and/or the second test current are stored. According to these profiles or corresponding to the characteristic curves, the activation of the voltage source, the first current source and the second current source can then be carried out by means of the control device. Consequently, different test procedures can be carried out in an easy way. Furthermore, the behavior of an actual load or of actual consumers can be replicated by the setting of the test voltage, the first test current and the second test current.

In a further embodiment, the electrical test voltage generated by the voltage source is greater than 100 volts, in particular greater than 250 volts, and a current intensity of the test current provided by the first current source and/or the second current source is greater than 100 amperes, in particular greater than 200 amperes. As already explained, a high voltage is provided as the test voltage by the voltage source. This test voltage is preferably over 250 volts. For example, the test voltage may be 500 volts. DC voltage is provided in particular as the test voltage. Furthermore, a high current, in particular a current greater than 200 amperes, is respectively provided by the first current source and the second current source. For example, the first test current and/or the second test current may be in each case 400 amperes. The first test current and the second test current are respectively provided as DC current in particular. The current intensity provided by the voltage source may be relatively low and be for example several microamperes to milliamperes. The electrical voltage provided by the respective current sources may be several millivolts to several volts. Consequently, a low electrical power output is provided by the respective sources. As a result, they can be provided in a more space-saving and low-cost way.

Furthermore, it is advantageous if the first circuit and/or the second circuit has at least two branches for respective inputs and/or outputs of the switch device. It may be the case that the switch device that is to be tested may have a number of inputs or outputs. For this purpose, the first circuit and/or the second circuit may respectively have at least two branches. In this case, each of the branches may be assigned a resistance or a resistance element. Consequently, a parallel connection of the resistances of the respective branches is obtained. The respective branches may then be connected to the corresponding inputs or outputs. Consequently, switch devices that have a number of inputs and/or outputs can also be tested by means of the test apparatus. Generally, on this principle other components that pass energy through them, for example power distributors, could also be tested. In the case of power distributors, it may be necessary that a number of current sources are implemented, in order to be able to set the current separately at each output.

In a further embodiment, when testing at least two switch devices electrically connected in series, the respective positive high-voltage paths are part of the first circuit and the respective negative high-voltage paths are part of the second circuit. In many tests, it is necessary to test a number of identical switch devices simultaneously, in order for example to determine a variance in the test results. In this case, a number of switch devices may be connected in series. Consequently, for example, safety verification may be carried out in compliance with the standard LV124, in which a relatively high number of test pieces are required. For example, six switch devices may be electrically connected in series here. In this case, all of the positive high-voltage paths are supplied with current by the first current source and all of the negative high-voltage paths are supplied with current by the second current source. Furthermore, the test voltage that is provided by the voltage source is present in each of the insulating resistances.

According to a further embodiment, the voltage source, the first current source and/or the second current source are arranged in a common housing. It may also be provided that the control device is arranged in this housing. Furthermore, the at least one isolating device or the isolating transformers may be arranged in the housing. Consequently, a compact construction can be made possible. As an alternative to this, the voltage source, the first current source and/or the second current source may be respectively arranged in a separate housing. This makes flexible positioning of the individual sources possible.

An arrangement according to the invention comprises a test apparatus according to the invention and at least one switch device. The arrangement may also comprise a number of switch devices that are electrically connected in series.

A method according to the invention serves for testing at least one switch device for a high-voltage battery of a vehicle. This involves generating an electrical test voltage between a positive high-voltage path and a negative high-voltage path of the at least one switch device by means of a voltage source. In addition, a first electrical test current is fed into the positive high-voltage path by means of a first current source, wherein a first connecting device, the first current source, and the positive high-voltage path form a first circuit when testing the at least one switch device, and a second electrical test current is fed into the negative high-voltage path by means of a second current source, wherein a second connecting device, the second current source and the negative high-voltage path together form a second circuit when testing the at least one switch device.

The preferred embodiments presented with respect to the test apparatus according to the invention and their advantages apply correspondingly to the arrangement according to the invention and also to the method according to the invention.

Further features of the invention emerge from the claims, the figures and the description of the figures. The features and combinations of features mentioned above in the description and the features and combinations of features mentioned in the description of the figures below and/or shown in the figures alone can be used not only in the respectively stated combination but also in other combinations or alone.

The invention is now explained in more detail on the basis of a preferred exemplary embodiment and also with reference to the drawings.

In the figures, elements that are the same or functionally the same are provided with the same designations.

DETAILED DESCRIPTION OF THE DRAWINGS

Figure 1:
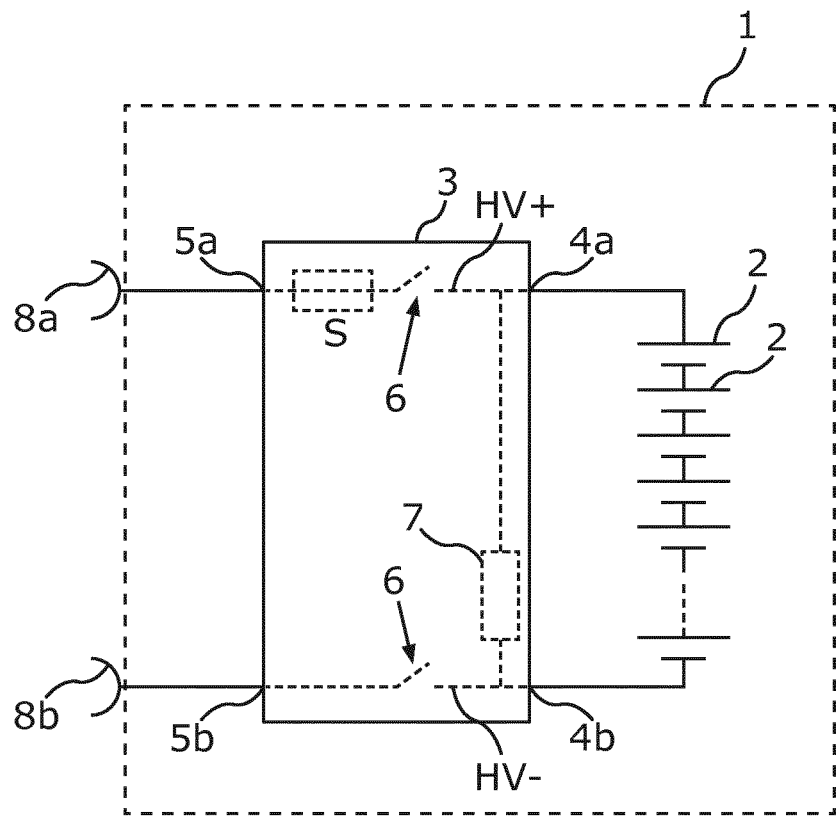
FIG. 1 is a schematic representation of a high-voltage battery for a vehicle, which comprises a switch device.

FIG. 1 shows in a schematic representation a high-voltage battery 1 for a vehicle. The high-voltage battery 1 may be used in particular as a traction battery and supply a drive motor of the vehicle with electrical energy. The high-voltage battery 1 comprises a plurality of battery cells 2, which are electrically connected in series. In addition, the high-voltage battery 1 comprises a switch device 3, which is electrically connected to the battery cells 2. The switch device 3 has a positive high-voltage path HV+, which connects a first input 4a and a first output 5a. Moreover, the switch device 3 has a negative high-voltage path HV−, which connects a second input 4b to a second output 5b. The respective high-voltage paths HV+ and HV− have in each case a switching element 6, which may be formed as a relay, switch, pyrotechnic isolating switch or the like. Furthermore, a fuse S is provided in the positive high-voltage path HV+. The high-voltage paths HV+ and HV− are each intrinsically formed with low impedance (when the switching elements 6 are closed). For example, the respective high-voltage paths HV+ and HV− have in each case a resistance of between 0.5 and 10 milliohms. The high-voltage paths HV+ and HV− are isolated with high impedance in the switch device 3 by an insulating device 7. This insulating device 7 has an insulating resistance, which may typically be several megaohms to several gigaohms. Connected parallel to the insulating resistance may also be a very high measuring resistance, which serves for measuring the electrical voltage. The first output 5*a* of the switch device 3 is connected to a positive terminal 8*a* of the high-voltage battery 1 and the second output 5*b* is connected to a negative terminal 8*b* of the high-voltage battery 1.

Figure 2:
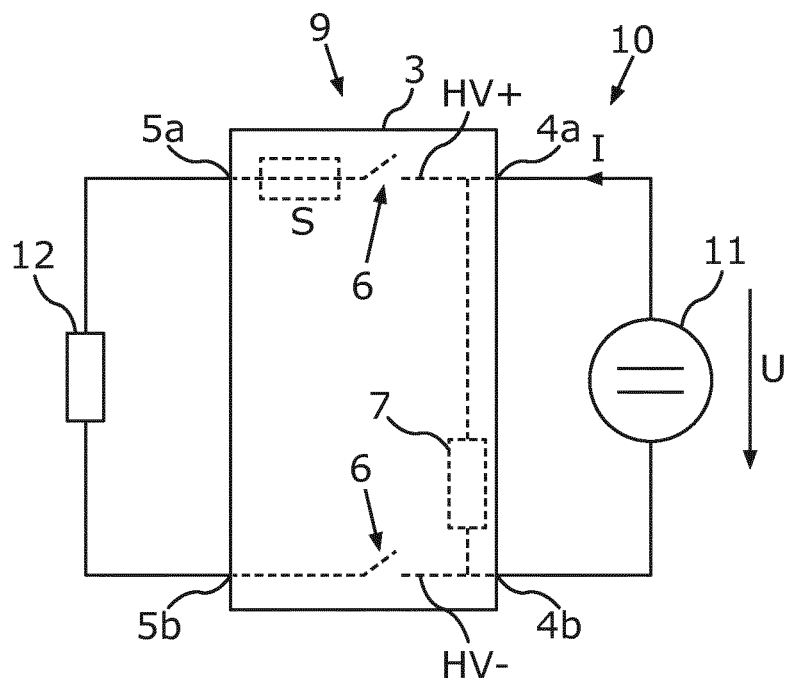
FIG. 2 is an arrangement with the switch device and also a test apparatus for testing the switch device according to the prior art.

FIG. 2 shows an arrangement 9, which has the switch device 3 and also a test apparatus 10 according to the prior art, wherein the test apparatus 10 serves for testing the switch device 3. If the switch device 3 is to be tested alone, but under the full electrical voltage and with the full electrical current, an electrical high-power source 11 that can simultaneously generate a high electrical current I and a high electrical test voltage U is used instead of the battery cells 2. This high-voltage source 11 is connected to the inputs 4*a*, 4*b* of the switch device 3. Connected to the outputs 5*a*, 5*b* is an electronic load 12 or high-power load, which can then also take up the high electrical power output. In this setup or this arrangement 9 according to the prior art, the high-power source 11 and the load 12 are designed for a high electrical power output. This gives rise to the disadvantage that high costs are produced.

Figure 3:
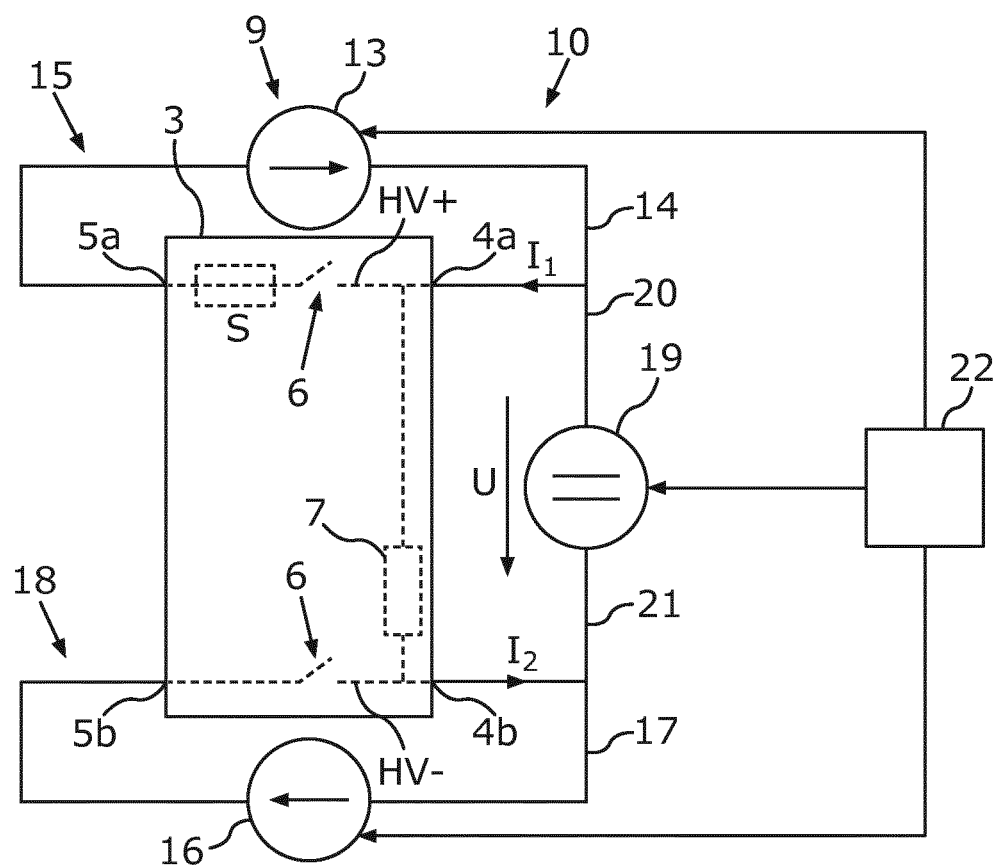
FIG. 3 is an arrangement of a test apparatus according to a first embodiment.

FIG. 3 shows an arrangement 9 with a switch device 3 and a test apparatus 10 according to a first embodiment. Also with this test apparatus 10, a high-current and high-voltage test of the switch device 3 can be carried out, but without a high power source 11 and a load 12. The test apparatus 10 comprises a first current source 13, by means of which a first test current $I_1$ can be fed into the positive high-voltage path HV+ of the switch device 3. Furthermore, the test apparatus 9 comprises a first connecting device 14, by means of which the first current source 13 and the positive high-voltage path HV+ can be electrically connected to one another. In the testing of the switch device 3 or in the connecting as intended of the test apparatus 10 to the switch device 3, the first current source 13, the first connecting device 14 and the positive high-voltage path HV+ form a first circuit 15. In addition, the test apparatus 9 comprises a second current source 16, by means of which a second test current $I_2$ can be fed into the negative high-voltage path HV− of the switch device 3. Furthermore, the test apparatus 9 comprises a second connecting device 17 for electrically connecting the second current source 16 to the negative high-voltage path HV−. The second current source 16, the second connecting device 17 and also the negative high-voltage path HV− together form a second circuit 18. Furthermore, the test apparatus 9 comprises a voltage source 19, which is connected by way of a third connecting device 20 to the positive high-voltage path HV+ and the negative high-voltage path HV−. With the voltage source 19, the test voltage U can be applied to the isolating device 7 or between the positive high-voltage path HV+ and the negative high-voltage path HV−. In this case, the voltage source 19, the third connecting device 20 and the isolating device 7 form a third circuit 21. The respective connecting devices 14, 17 and 20 may for example be provided by corresponding connecting lines, cables and/or plug-in connectors.

In the present case, the current sources 13, 16 and also the voltage source 19 are isolated from one another, so that only low electrical power outputs have to be implemented. In this case, the previously described three separate circuits are produced, to be specific the first circuit 15, the second circuit 18 and the third circuit 21. With the first current source 13 and the second current source 16, high electrical test currents $I_1$ and $I_2$ are generated, but in each case only low electrical voltages, because they each only have to separately handle a small electrical resistance of the positive high-voltage path HV+ and of the negative high-voltage path HV−. The voltage source 19 provides the high electrical test voltage U, but only generates a very low electrical current, which flows over the high insulating resistance of the insulating device 7. Consequently, none of the current sources 13, 16 nor the voltage source 19 has to have a high power output, because none of the sources 13, 16, 19 has to generate high electrical voltages and a high electrical current simultaneously.

In addition, the test apparatus 9 comprises a control device 22, which is connected to the first current source 13, the second current source 16 and also the voltage source 19. By means of the control device 22, for example, control signals can be transmitted to the sources 13, 16 and 19. The sources 13, 16, 19 may be controlled by the control device 22, by the transmission of the control signals, in such a way that the test voltage U of the voltage source 19 and the respective current intensities of the test currents $I_1$ and $I_2$ of the current sources 13, 16 can be set. In this way, the behavior of an actual load can be replicated, that is to say the relationship of the electrical test currents $I_1$, $I_2$ and electrical test voltage U corresponds to reality. Furthermore, it is provided that the test apparatus 9 has at least one isolating device (not represented here) for galvanically isolating the sources 13, 16, 19 from an electrical supply network. This isolation may be incorporated in the respective source 13, 16, 19 or be provided with the aid of an isolating transformer.

The test apparatus 9 results in much lower costs, because the respective sources 13, 16, 19 do not have to provide a high electrical power output. However, the sources 13, 16, 19 allow the switch device 3 to be operated in a realistic way with the switching elements 6 closed. This can be used particularly for long-lasting endurance tests. If, for example, a system is tested with a test voltage of 500 volts and a test current of 400 amperes, the electrical power output in a setup or an arrangement 9 according to the prior art is 500 volts×400 amperes=200 kilowatts. In the proposed test setup, assuming an electrical resistance in the positive high-voltage path HV+ and the negative high-voltage path HV− of in each case 2 milliohms and an insulating resistance of the insulating device 7 of 1 megaohm, the power output of the three sources 13, 16, 19 is in total: 2×400 amperes× 400 amperes×2 milliohms+500 volts×500 volts/1 megaohm=0.64025 kilowatt. Consequently, an electrical power output that is over 300 times smaller than in the case of a setup according to the prior art is required.

Figure 4:
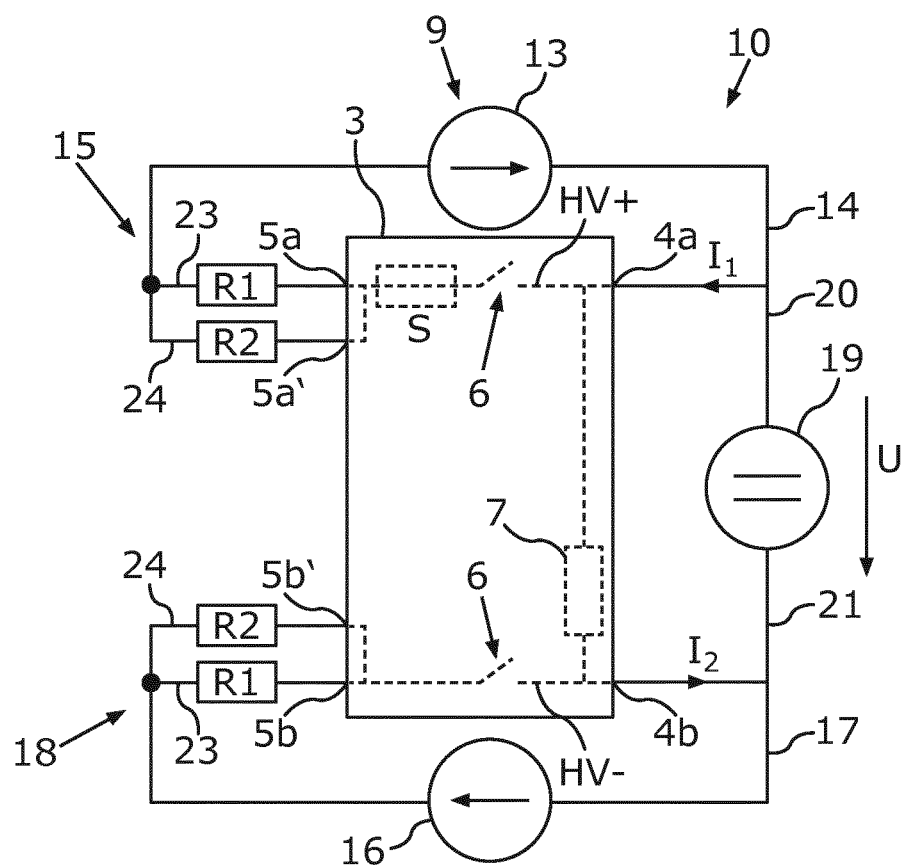
FIG. 4 is an arrangement with a test apparatus according to a further embodiment, wherein the switch device has a number of outputs.

FIG. 4 shows an arrangement 9 according to a further embodiment. In this case, the switch device 3 has two first outputs 5*a* and 5*a*'. Furthermore, the switch device 3 has two second outputs 5*b* and 5*b*'. In the first circuit 15, the respective outputs 5*a* and 5*a*' are assigned respective branches 23 and 24. In the first branch 23, which is assigned to the output 5*a*, a first resistance R1 is provided. In a second branch 24, which is assigned to the second output 5*a*', a second resistance R2 is provided. In the second circuit 18, two branches 23, 24 are likewise provided for the respective outputs 5*b* and 5*b*'. Here, too, the first resistance R1 is arranged in a first branch 23, which is connected to the output 5*b*, and the second resistance R2 is arranged in the second branch 24, which is connected to the output 5$b'$. The resistances R1, R2 allow the respective test current $I_1$, $I_2$ to be divided among the respective outputs 5$a$, 5$a'$, 5$b$, 5$b'$. If the switch device 3 has a number of inputs, corresponding branches may be provided for them.

Figure 5:
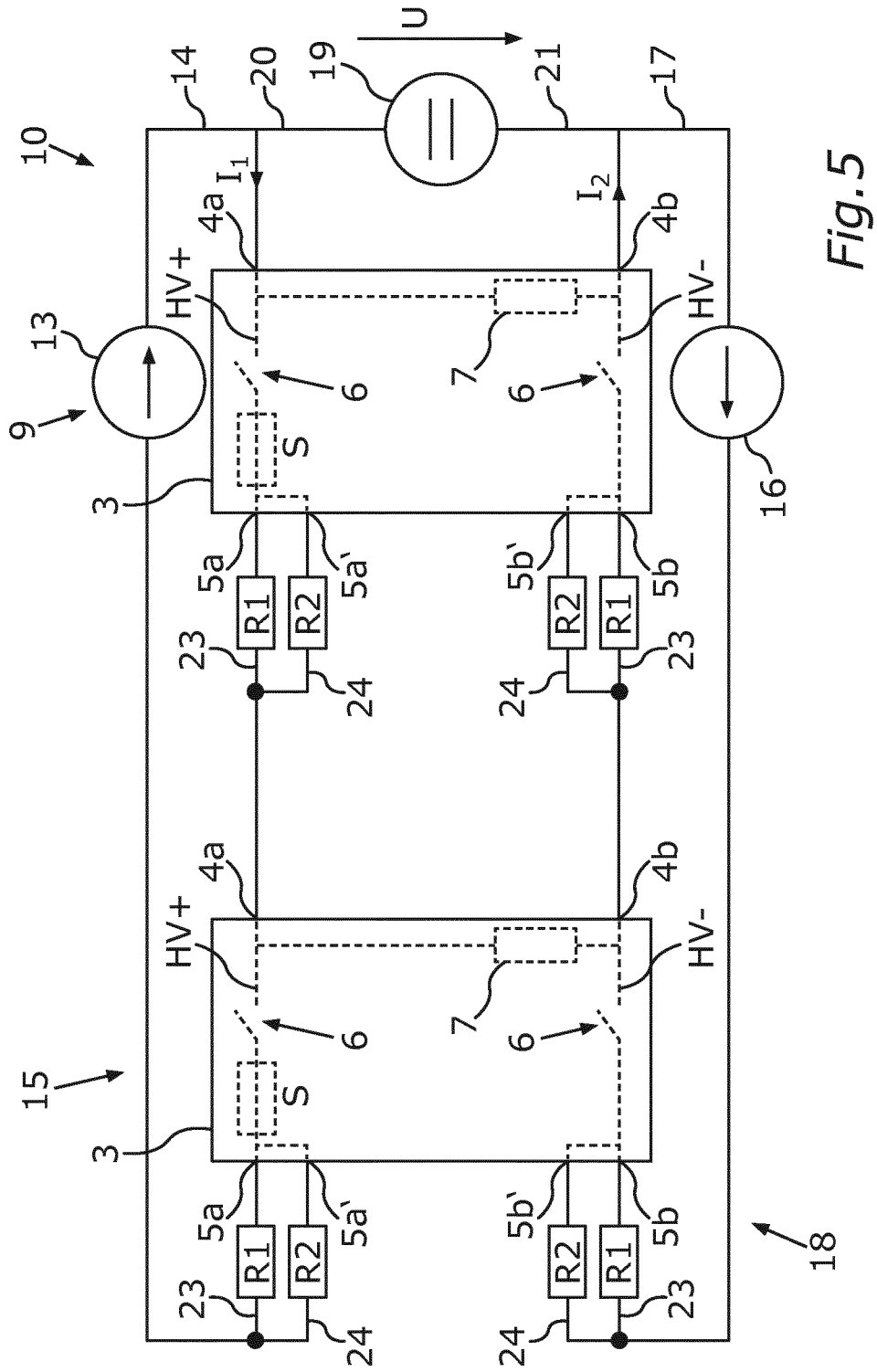
FIG. 5 is an arrangement according to a further embodiment, in which the switch devices are electrically connected in series.

In many tests it is necessary that a number of switch devices 3 are tested. For this purpose, a number of switch devices 3 may be electrically connected in series. This is represented by way of example in FIG. 5, which shows an arrangement 9 in which two switch devices 3 are electrically connected in series. Here, the respective positive high-voltage paths HV+ of the respective switch devices 3 are assigned to the first circuit. Furthermore, the respective negative high-voltage paths HV− of the switch devices 3 are assigned to the second circuit 18. The test voltage U provided by the voltage source 19 is present at the respective insulating devices 7 or insulating resistances.

LIST OF REFERENCE SIGNS

1 High-voltage battery
2 Battery cell
3 Switch device
4$a$ Input
4$b$ Input
5$a$ Output
5$a'$ Output
5$b$ Output
5$b'$ Output
6 Switching element
7 Insulating device
8$a$ Terminal
8$b$ Terminal
9 Arrangement
10 Test apparatus
11 High power source
12 Load
13 First current source
14 First connecting device
15 First circuit
16 Second current source
17 Second connecting device
18 Second circuit
19 Voltage source
20 Third connecting device
21 Third circuit
22 Control device
23 Path
24 Path
HV+ Positive high-voltage path
HV− Negative high-voltage path
I Electrical current
I1 First test current
I2 Second test current
R1 Resistance
R2 Resistance
S Fuse
U Test voltage

What is claimed is:

1. A test apparatus for simultaneously testing at least two switch devices for a high-voltage battery of a vehicle, comprising:
   a voltage source for generating an electrical test voltage between a positive high-voltage path and a negative high-voltage path of the at least two switch devices;
   a first connecting device and a first current source for feeding a first electrical test current into the positive high-voltage path, wherein the first connecting device, the first current source and the positive high-voltage path together form a first circuit when testing the at least two switch devices, and
   a second connecting device and a second current source for feeding a second electrical test current into the negative high-voltage path, wherein the second connecting device, the second current source and the negative high-voltage path together form a second circuit when testing the at least two switch devices, wherein
   the at least two switch devices are electrically connected in series, such that respective positive high-voltage paths of the at least two switch devices are part of the first circuit and respective negative high-voltage paths of the at least two switch devices are part of the second circuit,
   the first current source is configured to feed the first electrical test current into the respective positive high-voltage paths of the at least two switch devices, and
   the second current source is configured to feed the second electrical test current into the respective negative high-voltage paths of the at least two switch devices.

2. The test apparatus according to claim 1, further comprising:
   a third connecting device, wherein the voltage source, the third connecting device and an insulating device of the switch device between the positive high-voltage path and the negative high-voltage path form a third circuit.

3. The test apparatus according to claim 1, further comprising:
   at least one isolating device for galvanically isolating the voltage source, the first current source and/or the second current source from an electrical supply network.

4. The test apparatus according to claim 1, further comprising:
   a control device for independently activating the voltage source, the first current source and/or the second current source.

5. The test apparatus according to claim 1, wherein
   the electrical test voltage generated by the voltage source is greater than 100 volts, and
   a current intensity of the test current provided by the first current source and/or the second current source is greater than 100 amperes.

6. The test apparatus according to claim 1, wherein
   the electrical test voltage generated by the voltage source is greater than 250 volts, and
   a current intensity of the test current provided by the first current source and/or the second current source is greater than 200 amperes.

7. The test apparatus according to claim 1, wherein
   the first circuit and/or the second circuit has at least two branches for respective inputs and/or outputs of the switch device.

8. The test apparatus according to claim 1, wherein
   the voltage source, the first current source and/or the second current source are arranged in a common housing.

9. The test apparatus according to claim 1, wherein
   at least one of the voltage source, the first current source or the second current source is arranged in a separate housing.

10. An arrangement, comprising:
    a test apparatus according to claim 1; and
    at least two switch devices.

11. A method for simultaneously testing at least two switch devices for a high-voltage battery of a vehicle, in which an electrical test voltage between a positive high-voltage path and a negative high-voltage path of the at least two switch devices is generated by way of a voltage source, the method comprising:
feeding a first electrical test current into the positive high-voltage path by way of a first current source, wherein a first connecting device, the first current source and the positive high-voltage path together form a first circuit; and
feeding a second electrical test current into the negative high-voltage path by way of a second current source, wherein a second connecting device, the second current source and the negative high-voltage path together form a second circuit, wherein
the at least two switch devices are electrically connected in series, such that respective positive high-voltage paths of the at least two switch devices are part of the first circuit and respective negative high-voltage paths of the at least two switch devices are part of the second circuit,
the first current source feeds the first electrical test current into the respective positive high-voltage paths of the at least two switch devices, and
the second current source feeds the second electrical test current into the respective negative high-voltage paths of the at least two switch devices.

* * * * *